US011515309B2

(12) United States Patent
Purayath et al.

(10) Patent No.: US 11,515,309 B2
(45) Date of Patent: Nov. 29, 2022

(54) PROCESS FOR PREPARING A CHANNEL REGION OF A THIN-FILM TRANSISTOR IN A 3-DIMENSIONAL THIN-FILM TRANSISTOR ARRAY

(71) Applicant: SUNRISE MEMORY CORPORATION, Fremont, CA (US)

(72) Inventors: Vinod Purayath, Sedona, AZ (US); Jie Zhou, San Jose, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 83 days.

(21) Appl. No.: 17/125,477

(22) Filed: Dec. 17, 2020

(65) Prior Publication Data
US 2021/0193660 A1 Jun. 24, 2021

Related U.S. Application Data

(60) Provisional application No. 62/950,390, filed on Dec. 19, 2019.

(51) Int. Cl.
H01L 29/66 (2006.01)
H01L 27/105 (2006.01)
(Continued)

(52) U.S. Cl.
CPC ...... *H01L 27/1052* (2013.01); *H01L 21/3065* (2013.01); *H01L 29/6675* (2013.01);
(Continued)

(58) Field of Classification Search
CPC ............. H01L 27/1052; H01L 21/3065; H01L 29/6675; H01L 29/78642; H01L 29/78663;
(Continued)

(56) References Cited

U.S. PATENT DOCUMENTS 5,583,808 A 12/1996 Brahmbhatt
5,646,886 A 7/1997 Brahmbhatt
(Continued)

FOREIGN PATENT DOCUMENTS

JP 2010108522 A1 5/2010
JP 2011028540 A1 2/2011
(Continued)

OTHER PUBLICATIONS

"EP Extended Search Report EP168690149.3", dated Oct. 18, 2019.
(Continued)

*Primary Examiner* — Sheikh Maruf
(74) *Attorney, Agent, or Firm* — Edward C. Kwok; VLP Law Group LLP

(57) ABSTRACT

A process includes (a) providing a semiconductor substrate having a planar surface; (b) forming a plurality of thin-film layers above the planar surface of the semiconductor substrate, one on top of another, including among the thin-film layers first and second isolation layers, wherein a significantly greater concentration of a first dopant specie is provided in the first isolation layer than in the second isolation layer; (c) etching along a direction substantially orthogonal to the planar surface through the thin-films to create a trench having sidewalls that expose the thin-film layers; (d) depositing conformally a semiconductor material on the sidewalls of the trench; (e) annealing the first isolation layer at a predetermined temperature and a predetermined duration such that the first isolation layer act as a source of the first dopant specie which dopes a portion of the semiconductor material adjacent the first isolation layer; and (f)
(Continued)

selectively etching the semiconductor material to remove the doped portion of the semiconductor material without removing the remainder of the semiconductor material.

19 Claims, 6 Drawing Sheets

(51) Int. Cl.
    *H01L 29/786*     (2006.01)
    *H01L 21/3065*     (2006.01)

(52) U.S. Cl.
    CPC .. *H01L 29/78642* (2013.01); *H01L 29/78663* (2013.01); *H01L 29/78672* (2013.01)

(58) Field of Classification Search
    CPC ......... H01L 29/78672; H01L 27/11551; H01L 27/11578; H01L 21/31116
    USPC ........................................................ 438/268
    See application file for complete search history.

(56) References Cited

U.S. PATENT DOCUMENTS

| | | | |
|---|---|---|---|
| 5,656,842 A | 8/1997 | Iwamatsu | |
| 5,768,192 A | 6/1998 | Eitan | |
| 5,789,776 A | 8/1998 | Lancaster et al. | |
| 5,915,167 A | 6/1999 | Leedy | |
| 6,040,605 A | 3/2000 | Sano et al. | |
| 6,107,133 A | 8/2000 | Furukawa et al. | |
| 6,118,171 A | 9/2000 | Davies et al. | |
| 6,130,838 A | 10/2000 | Kim et al. | |
| 6,313,518 B1 | 11/2001 | Ahn et al. | |
| 6,314,046 B1 | 11/2001 | Kamiya et al. | |
| 6,362,508 B1* | 3/2002 | Rasovsky | H01L 27/11517 |
| | | | 257/E21.279 |
| 6,434,053 B1 | 8/2002 | Fujiwara | |
| 6,580,124 B1 | 6/2003 | Cleeves et al. | |
| 6,744,094 B2 | 6/2004 | Forbes | |
| 6,774,458 B2 | 8/2004 | Fricke et al. | |
| 6,781,858 B2* | 8/2004 | Fricke | H01L 27/249 |
| | | | 257/E27.081 |
| 6,873,004 B1 | 3/2005 | Han et al. | |
| 6,946,703 B2 | 9/2005 | Ryu et al. | |
| 7,005,350 B2 | 2/2006 | Walker et al. | |
| 7,223,653 B2* | 5/2007 | Cheng | H01L 27/1087 |
| | | | 438/249 |
| 7,307,308 B2 | 12/2007 | Lee | |
| 7,489,002 B2 | 2/2009 | Forbes et al. | |
| 7,524,725 B2 | 4/2009 | Chung | |
| 7,612,411 B2 | 11/2009 | Walker | |
| 8,026,521 B1 | 9/2011 | Or-Bach et al. | |
| 8,139,418 B2 | 3/2012 | Carman | |
| 8,178,396 B2 | 5/2012 | Sinha et al. | |
| 8,278,183 B2* | 10/2012 | Lerner | H01L 21/743 |
| | | | 438/424 |
| 8,630,114 B2 | 1/2014 | Lue | |
| 8,767,473 B2 | 7/2014 | Shim et al. | |
| 8,848,425 B2 | 9/2014 | Schloss | |
| 8,878,278 B2 | 11/2014 | Alsmeier et al. | |
| 9,190,293 B2 | 11/2015 | Wang et al. | |
| 9,202,694 B2 | 12/2015 | Konevecki et al. | |
| 9,230,985 B1 | 1/2016 | Wu et al. | |
| 9,412,752 B1 | 8/2016 | Yeh et al. | |
| 9,748,172 B2 | 8/2017 | Takaki | |
| 9,842,651 B2 | 12/2017 | Harari | |
| 9,892,800 B2 | 2/2018 | Harari | |
| 9,911,497 B1 | 3/2018 | Harari | |
| 10,074,667 B1 | 9/2018 | Higashi | |
| 10,096,364 B2 | 10/2018 | Harari | |
| 10,121,553 B2 | 11/2018 | Harari | |
| 10,157,780 B2* | 12/2018 | Wu | H01L 21/76822 |
| 10,249,370 B2 | 4/2019 | Harari | |
| 10,254,968 B1 | 4/2019 | Gazit et al. | |
| 10,373,956 B2 | 8/2019 | Gupta et al. | |
| 10,381,378 B1 | 8/2019 | Harari | |
| 10,395,737 B2 | 8/2019 | Harari | |
| 10,431,596 B2 | 10/2019 | Herner et al. | |
| 10,475,812 B2 | 11/2019 | Harari | |
| 10,622,377 B2 | 4/2020 | Harari et al. | |
| 2001/0030340 A1 | 10/2001 | Fujiwara | |
| 2001/0053092 A1 | 12/2001 | Kosaka et al. | |
| 2002/0028541 A1 | 3/2002 | Lee et al. | |
| 2002/0051378 A1 | 5/2002 | Ohsawa | |
| 2002/0193484 A1 | 12/2002 | Albee | |
| 2004/0000679 A1* | 1/2004 | Patel | H01L 27/105 |
| | | | 257/E27.06 |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2005/0128815 A1 | 6/2005 | Ishikawa et al. | |
| 2005/0236625 A1* | 10/2005 | Schuele | H01L 29/78642 |
| | | | 257/E29.279 |
| 2005/0280061 A1 | 12/2005 | Lee | |
| 2006/0155921 A1 | 7/2006 | Gorobets et al. | |
| 2008/0160765 A1* | 7/2008 | Lee | H01L 21/31122 |
| | | | 438/700 |
| 2008/0239812 A1 | 10/2008 | Naofumi et al. | |
| 2008/0301359 A1 | 12/2008 | Smith | |
| 2009/0057722 A1 | 3/2009 | Masuoka et al. | |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0316487 A1 | 12/2009 | Lee et al. | |
| 2010/0124116 A1 | 5/2010 | Takashi et al. | |
| 2010/0128509 A1 | 5/2010 | Kim et al. | |
| 2011/0044113 A1 | 2/2011 | Kim | |
| 2011/0115011 A1 | 5/2011 | Masuoka et al. | |
| 2011/0143519 A1* | 6/2011 | Lerner | H01L 21/743 |
| | | | 438/433 |
| 2011/0208905 A1 | 8/2011 | Shaeffer et al. | |
| 2011/0298013 A1 | 12/2011 | Hwang et al. | |
| 2012/0074478 A1* | 3/2012 | Sugimachi | H01L 27/1052 |
| | | | 257/297 |
| 2012/0182801 A1 | 7/2012 | Lue | |
| 2012/0223380 A1* | 9/2012 | Lee | H01L 29/42332 |
| | | | 257/E21.422 |
| 2012/0243314 A1 | 9/2012 | Takashi | |
| 2012/0307568 A1 | 12/2012 | Banna et al. | |
| 2012/0327714 A1 | 12/2012 | Lue | |
| 2013/0031325 A1 | 1/2013 | Nakamoto et al. | |
| 2013/0256780 A1 | 10/2013 | Kai et al. | |
| 2013/0337646 A1* | 12/2013 | Cernea | H01L 45/1233 |
| | | | 438/666 |
| 2014/0015036 A1 | 1/2014 | Fursin et al. | |
| 2014/0040698 A1 | 2/2014 | Loh et al. | |
| 2014/0117366 A1 | 5/2014 | Saitoh | |
| 2014/0151774 A1 | 6/2014 | Rhie | |
| 2014/0213032 A1* | 7/2014 | Kai | H01L 45/149 |
| | | | 438/382 |
| 2014/0229131 A1 | 8/2014 | Cohen et al. | |
| 2014/0247674 A1 | 9/2014 | Karda et al. | |
| 2014/0252454 A1* | 9/2014 | Rabkin | H01L 27/2454 |
| | | | 257/329 |
| 2014/0252532 A1* | 9/2014 | Yang | H01L 21/76897 |
| | | | 257/503 |
| 2014/0328128 A1 | 11/2014 | Louie et al. | |
| 2014/0340952 A1 | 11/2014 | Ramaswamy et al. | |
| 2015/0079743 A1* | 3/2015 | Pachamuthu | H01L 29/7926 |
| | | | 438/268 |
| 2015/0079744 A1* | 3/2015 | Hwang | H01L 27/10814 |
| | | | 438/268 |
| 2015/0098272 A1 | 4/2015 | Kasolra et al. | |
| 2015/0113214 A1 | 4/2015 | Sutardja | |
| 2015/0129955 A1* | 5/2015 | Mueller | G11C 11/40 |
| | | | 257/329 |
| 2015/0187823 A1* | 7/2015 | Miyairi | H01L 29/78651 |
| | | | 257/43 |
| 2015/0194440 A1 | 7/2015 | Noh et al. | |
| 2015/0206886 A1* | 7/2015 | Guha | H01L 21/324 |
| | | | 438/239 |

(56) References Cited

U.S. PATENT DOCUMENTS

| | | |
|---|---|---|
| 2015/0249143 A1 | 9/2015 | Sano |
| 2015/0340371 A1* | 11/2015 | Lue .................. H01L 29/66 |
| | | 257/324 |
| 2016/0019951 A1 | 1/2016 | Park et al. |
| 2016/0049404 A1* | 2/2016 | Mariani ............ H01L 21/8249 |
| | | 257/329 |
| 2016/0086953 A1* | 3/2016 | Liu .................. H01L 21/768 |
| | | 438/268 |
| 2016/0086970 A1 | 3/2016 | Peng |
| 2016/0225860 A1 | 8/2016 | Karda et al. |
| 2016/0300724 A1 | 10/2016 | Levy et al. |
| 2016/0314042 A1 | 10/2016 | Plants |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0358594 A1 | 12/2017 | Lu et al. |
| 2018/0108416 A1 | 4/2018 | Harari |
| 2018/0151419 A1* | 5/2018 | Wu .................. H01L 29/66636 |
| 2018/0269229 A1 | 9/2018 | Or-Bach et al. |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366489 A1 | 12/2018 | Harari et al. |
| 2019/0006009 A1 | 1/2019 | Harari |
| 2019/0019564 A1* | 1/2019 | Li .................. H01L 45/085 |
| 2019/0157296 A1 | 5/2019 | Harari et al. |
| 2019/0180821 A1 | 6/2019 | Harari |
| 2019/0206890 A1 | 7/2019 | Harari et al. |
| 2019/0244971 A1 | 8/2019 | Harari |
| 2019/0259769 A1 | 8/2019 | Karda et al. |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0020718 A1 | 1/2020 | Harari et al. |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0203378 A1 | 6/2020 | Harari et al. |
| 2020/0219572 A1* | 7/2020 | Harari ............... G11C 16/0483 |
| 2020/0258897 A1 | 8/2020 | Yan et al. |

FOREIGN PATENT DOCUMENTS

| | | |
|---|---|---|
| KR | 20120085591 A1 | 8/2012 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052446", dated Dec. 11, 2019.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate (VG) TFT NANO Flash Using Junction-Free Buried Channel BE-SONOS Device", Symposium on VLSI: Tech. Dig. Of Technical Papers, 2010, pp. 131-132.
Tanaka, T., et al., "A 768 Gb 3b/cell 3D-Floaling-Gate NANO Flash Memory", Digest of Technical Papers, the 2016 IEEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"PCT Search Report and Written Opinion, PCT/US2021/042607", dated Nov. 4, 2021, 17 pages.
"PCT Search Report and Written Opinion, PCT/US2021/42620", dated Oct. 28, 2021, 18 pages.
"PCT Search Report and Written Opinion, PCT/US2020/065670", dated Apr. 5, 2021, 12 pages.

* cited by examiner

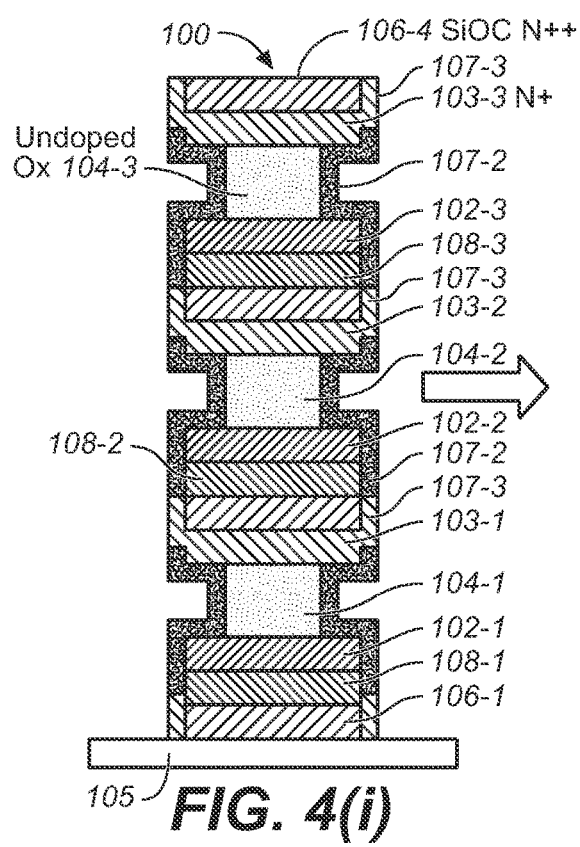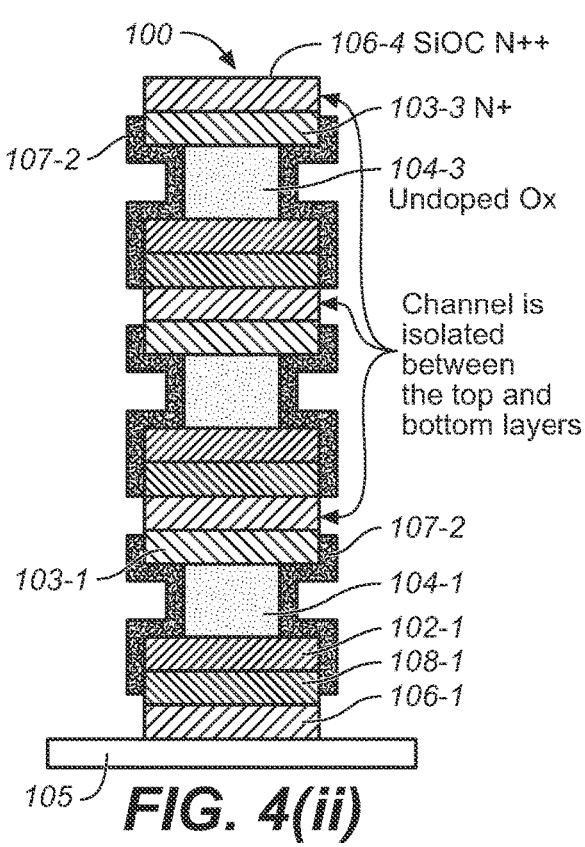

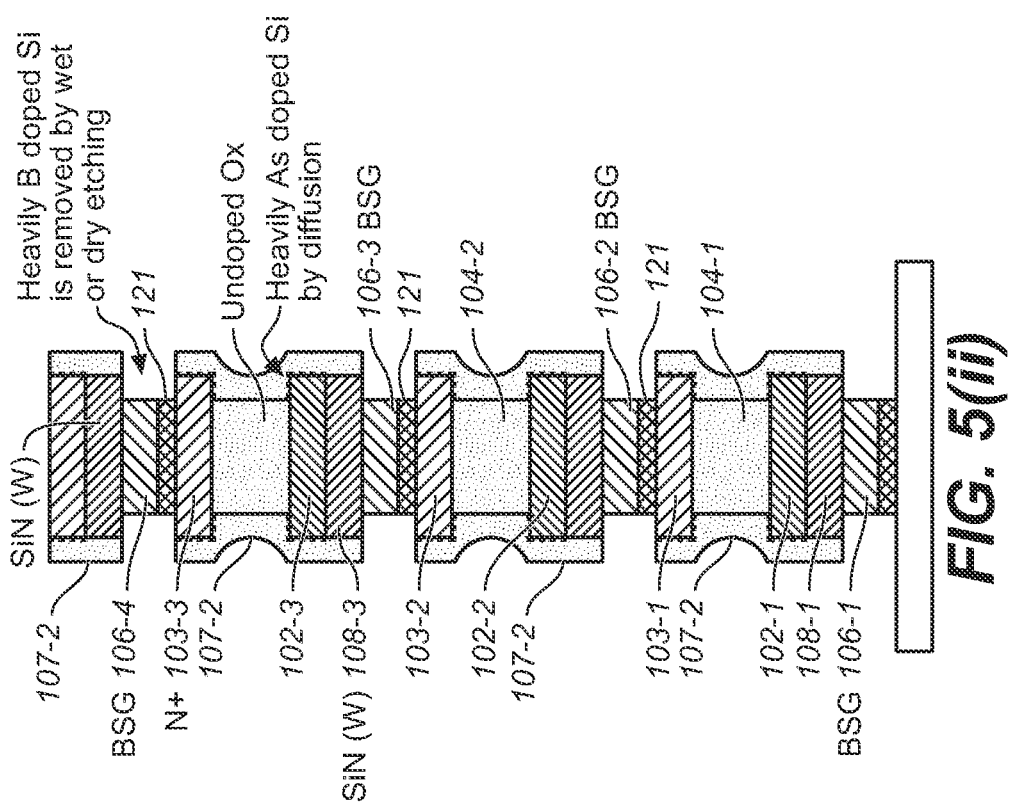
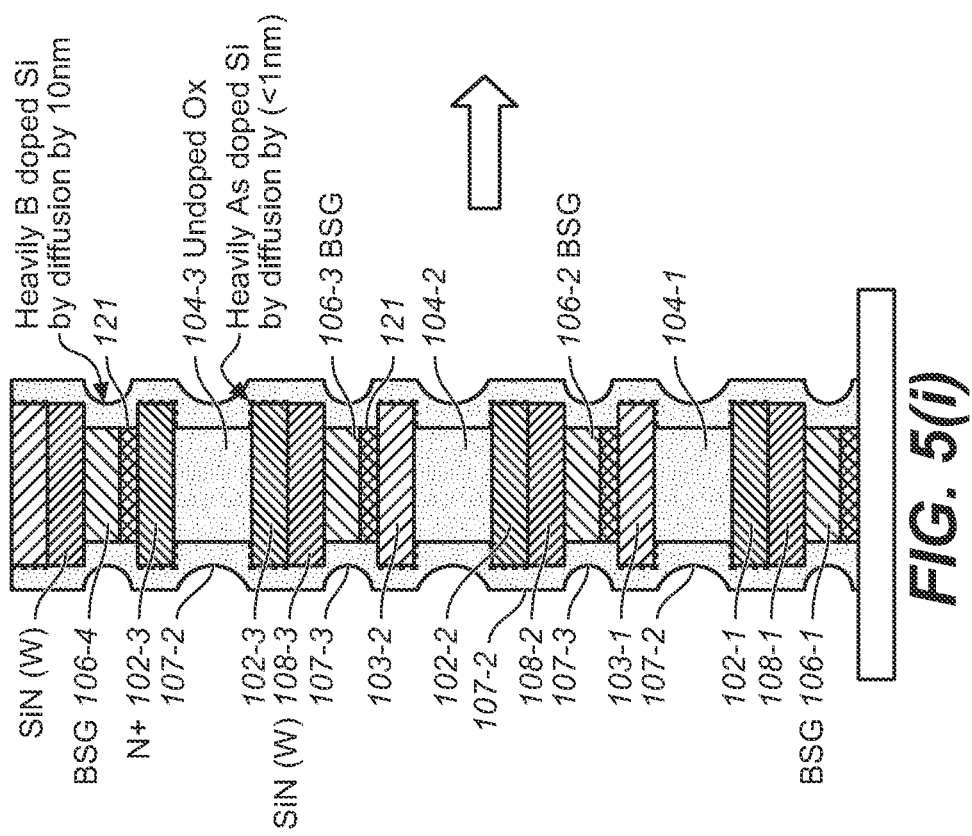

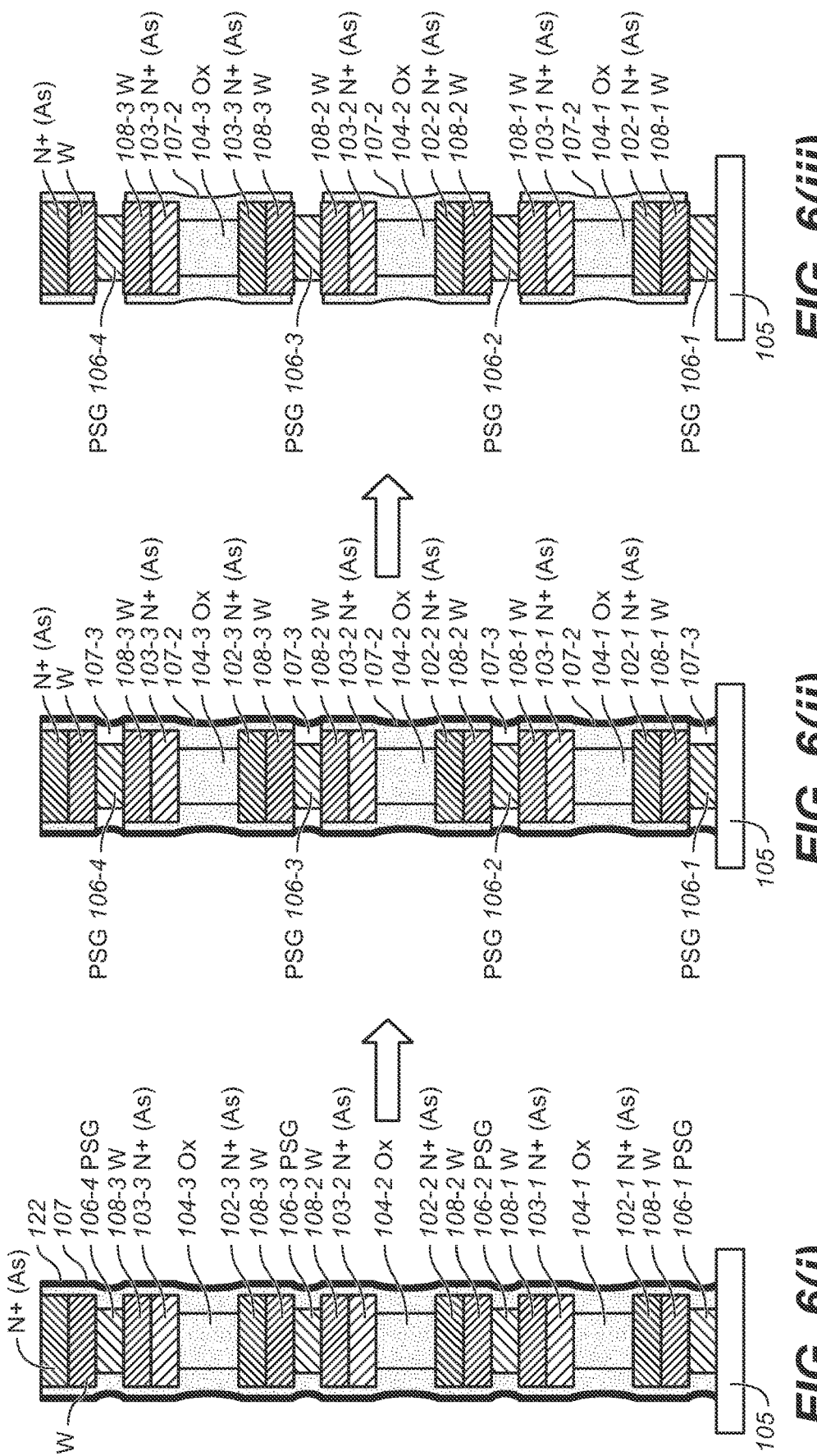

PROCESS FOR PREPARING A CHANNEL REGION OF A THIN-FILM TRANSISTOR IN A 3-DIMENSIONAL THIN-FILM TRANSISTOR ARRAY

CROSS REFERENCE TO RELATED APPLICATIONS

The present application is related to and claims priority of U.S. provisional patent application ("Provisional Application") Ser. No. 62/950,390, entitled "PROCESS FOR PREPARING A CHANNEL REGION OF A THIN-FILM TRANSISTOR IN A 3-DIMENSIONAL THIN-FILM TRANSISTOR ARRAY," filed on Dec. 19, 2019. The disclosure of the Provisional Application is hereby incorporated by reference in its entirety.

BACKGROUND OF THE INVENTION

1. Field of the Invention

The present invention relates to the processes used in manufacturing semiconductor circuits. In particular, the present invention relates to processes used in manufacturing 3-dimensional arrays of thin-film transistors, such as thin-film memory transistors.

2. Discussion of the Related Art 3-dimensional arrays of thin-film memory cells have been described, for example, in U.S. Pat. No. 10,121,553, entitled "Capacitive-Coupled Non-Volatile Thin-Film Transistor NOR Strings In 3-Dimensional Arrays," issued on Nov. 6, 2018. The '553 patent discloses a 3-dimensional array of NOR-type memory strings in which each NOR-type memory string comprises thin-film memory transistors formed along a horizontal strip of semiconductor materials, with each strip of semiconductor materials comprising a horizontal layer of channel material between two horizontal conductive semiconductor layers. The conductive semiconductor layers form a common drain region and a common source region, respectively, for the thin-film transistors of the NOR-type memory string.

The detailed description below refers to thin-film transistors formed above a planar surface of a semiconductor substrate. The terms "horizontal" and "vertical" refer to a direction substantially parallel and substantially orthogonal to the planar surface, respectively. For illustrative purpose, the X-direction and the Y-direction refer to two orthogonal directions parallel to the planar surface, and the Z-direction is orthogonal to both the X-direction and the Y-directions.

FIG. 1(a) shows structure 100 of a 3-dimensional thin-film transistor array at an intermediate step of formation. FIG. 1(a) is a vertical cross-section of structure 100. As shown in FIG. 1(a), structure 100 shows active stacks 101-1, 101-2 and 101-3—which are three of numerous parallel active stacks of semiconductor strips—separated from each other by trenches 109. In FIG. 1(a), each active stack includes a selected number of active strips 110 each isolated from its neighbors by isolation layers 106 (e.g., isolation layers 106-2 and 106-3 isolating active strip 110-2 from active strips 110-1 and 110-3). (The active stacks are arranged along the X-direction, each extending lengthwise along the Y-direction; each active strip also extends lengthwise along the Y-direction and are stacked along the Z-direction.) Also, in this detailed description, when a material or layer is generally referred to by a first reference numeral (e.g., n), specific instances of the material or layer are distinguished by a second reference numeral hyphenated to the first reference numeral (e.g., n-1, n-2, etc.).

In one implementation, each active stack includes eight active strips 110-1, 110-2, . . . , 110-8. For convenience of illustration only three active strips (e.g., active strips 110-1, 110-2 and 110-3) are shown for each of active stacks 101-1, 101-2, and 101-3. Generally, in a 3-dimensional thin-film transistor array, any suitable number of active stacks (e.g., 1, 2, 4, 16, 32, 64, 128, . . . ) and any suitable number of active strips (e.g., 1, 2, 4, 8, 16, . . . ) may be provided. In FIG. 1(a), the active strips (e.g., 5-nm-wide each) are isolated from each other by isolation layers 106 (e.g., isolation layers 106-1, 106-2, and 106-3). Each active strip includes common drain region, a common drain region and a body oxide layer in between (e.g., in active strip 110-1, common drain region 102-1, common source region 103-1 and body oxide layer 104-1). Each common drain region is also provided an adjacent metal layer to reduce resistance along its length (e.g., common drain region 102-1 is in contact with metal layer 108-1, such as tungsten). In some implementation, a sacrificial SiN layer stands in for metal layer 108-1, which is replaced by the metal at a subsequent step.

In a prior step, body oxide layers 104 (e.g., body oxide layers 104-1, 104-2 and 104-3) are isotropically etched to recess from the sidewalls of trenches 109. Thereafter, an intrinsic or lightly doped semiconductor material ("channel semiconductor material") is conformally deposited on the sidewalls of trenches 109. This channel semiconductor material, shown in FIG. 1(a) as layers 107, for example, are intended to serve as channel regions between the common drain region and the common source region for the thin-film storage transistors in each active strip.

To create the channel regions, a separation etch—typically an anisotropic etch—is subsequently carried out to remove the channel semiconductor material from the sidewalls of trench 109, without damaging the channel semiconductor material that has been deposited in the recesses over body oxide layers 104. FIG. 1(b) shows one instance of resulting structure 100 after a separation etch. However, because the separation etch has a high aspect-ratio (e.g., trenches 109 may each be 60-nm wide and 2-um deep), the channel semiconductor material adjacent the body oxide layer often becomes too thin due to sideway etching, as indicated by arrow A, and leaves undesirable stringers towards the bottom of trenches 109, as indicated by arrow B. Both excessive thinning of the channel semiconductor material adjacent the body oxide layer and leaving stringers on the sidewalls of the trenches are undesirable. Also, if metal layers 108 have already been provided, the anisotropic etch may sputter the metal to result in contamination.

SUMMARY

According to one embodiment of the present invention, a process includes (a) providing a semiconductor substrate having a planar surface; (b) forming a plurality of thin-film layers above the planar surface of the semiconductor substrate, one on top of another, including among the thin-film layers first and second isolation layers, wherein a significantly greater concentration of a first dopant specie is provided in the first isolation layer than in the second isolation layer; (c) etching along a direction substantially orthogonal to the planar surface through the thin-films to create a trench having sidewalls that expose the thin-film layers; (d) depositing conformally a semiconductor material (e.g., an amorphous silicon and a polysilicon) on the sidewalls of the trench; (e) annealing the first isolation layer at a predetermined temperature and a predetermined duration such that the first isolation layer act as a source of the first dopant specie which dopes a portion of the semiconductor material adjacent the first isolation layer; and (f) selectively etching (e.g., wet or dry etch) the semiconductor material to remove the doped portion of the semiconductor material without removing the remainder of the semiconductor material. The process may also include etching the thin-film layers such that the first isolation layer recesses from the sidewalls of the trench.

In one embodiment, the first isolation layer may include an organosilicon layer (e.g., SiOCH or SiOC), a silicon nitride layer or a silicate glass (e.g., BSG or PSG), and (ii) the selective etching uses an etchant that that may include tetra-methyl ammonium hydroxide (TMAH), potassium hydroxide (KOH), or ethylene diamine and pyrocatechol (EDP). In these cases, the annealing step may include a rapid thermal annealing step, and wherein the predetermined temperature is between 650° C. and 820° C., preferably about 750° C.

In another embodiment, the first isolation layer may be carbon-doped with a carbon dopant concentration of about $10^{20}$ cm$^{-3}$ or greater, and the selective etching uses an etchant that comprises ethylene diamine and pyrocatechol (EDP). In that case, the annealing step comprises a rapid thermal annealing step, and the predetermined temperature is between about 600° C. and about 820° C., preferably about 750° C.

In yet another embodiment, an additional material that is highly doped with a second dopant may be deposited adjacent and over the semiconductor material. An annealing step diffuses the second dopant specie into the semiconductor material, so as to adjust an effective dopant concentration in the semiconductor material. That effective dopant concentration may determine a threshold voltage of a thin-film transistor in which the semiconductor material serve as a channel region. In some embodiments, the first dopant specie may be boron and the second dopant specie may be phosphorus, or vice versa.

In yet another embodiment, the first isolation layer includes an organosilicon layer (e.g., BSG or PSG), with a dopant concentration greater than $1.0\times10^{22}$ cm$^{-3}$), a silicon nitride layer or a silicate glass, and the selective etching uses an etchant that may include atomic chlorine, HF (gaseous or in an aqueous solution) or a fluorocarbon gas. In this case, the annealing step may include a rapid thermal annealing step, and the predetermined temperature is between about 600° C. and about 820° C., preferably about 750° C. A suitable aqueous HF solution may include HF, nitric acid and acetic acid, in various suitable proportions. A capping layer may be deposited over the conformally deposited semiconductor material.

The present invention is better understood upon consideration of the detailed description below in conjunction with the accompanying drawings.

BRIEF DESCRIPTION OF THE DRAWINGS

FIGS. 4(i) and (ii) illustrate an alternatively embodiment of the present invention, in which isolation layers 106 dope their adjacent channel semiconductor material 107 for selective removal, in accordance with one embodiment of the present invention.

FIGS. 5(i) and (ii) illustrate a second embodiment of the present invention, in which isolation layers 106 dope their adjacent channel semiconductor material 107 for selective removal, in accordance with one embodiment of the present invention.

FIGS. 6(i), 6(ii) and 6(iii) illustrate a third alternatively embodiment of the present invention, in which isolation layers 106 dope their adjacent channel semiconductor material 107 for selective removal, in accordance with one embodiment of the present invention.

DETAILED DESCRIPTION OF THE PREFERRED EMBODIMENTS

The present invention avoids both the excessive thinning of the channel semiconductor material adjacent the body oxide layer and the stringers on the sidewalls of the trenches. Rather than depending on the directionality of the separation etch, the methods of the present invention chemically convert either the portions of the channel semiconductor material in the recesses adjacent the body oxide layers, or the portions of the channel semiconductor material on the sidewalls of the trenches, or both, such that a subsequent etch may selectively removes the portions of the channel semiconductor material from the sidewalls of the trenches.

Figure 1A:
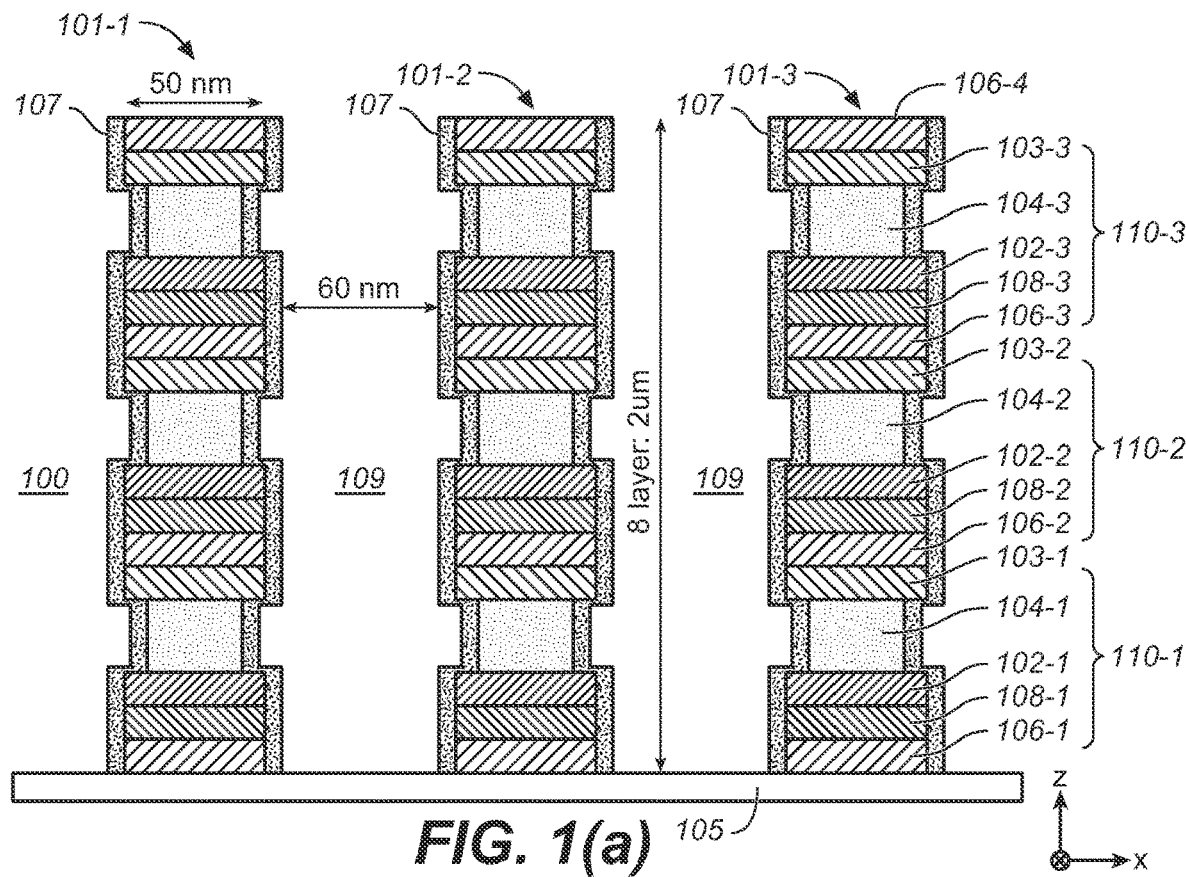
FIG. 1(a) shows structure 100 of a 3-dimensional thin-film transistor array at an intermediate step of formation.
Figure 1B:
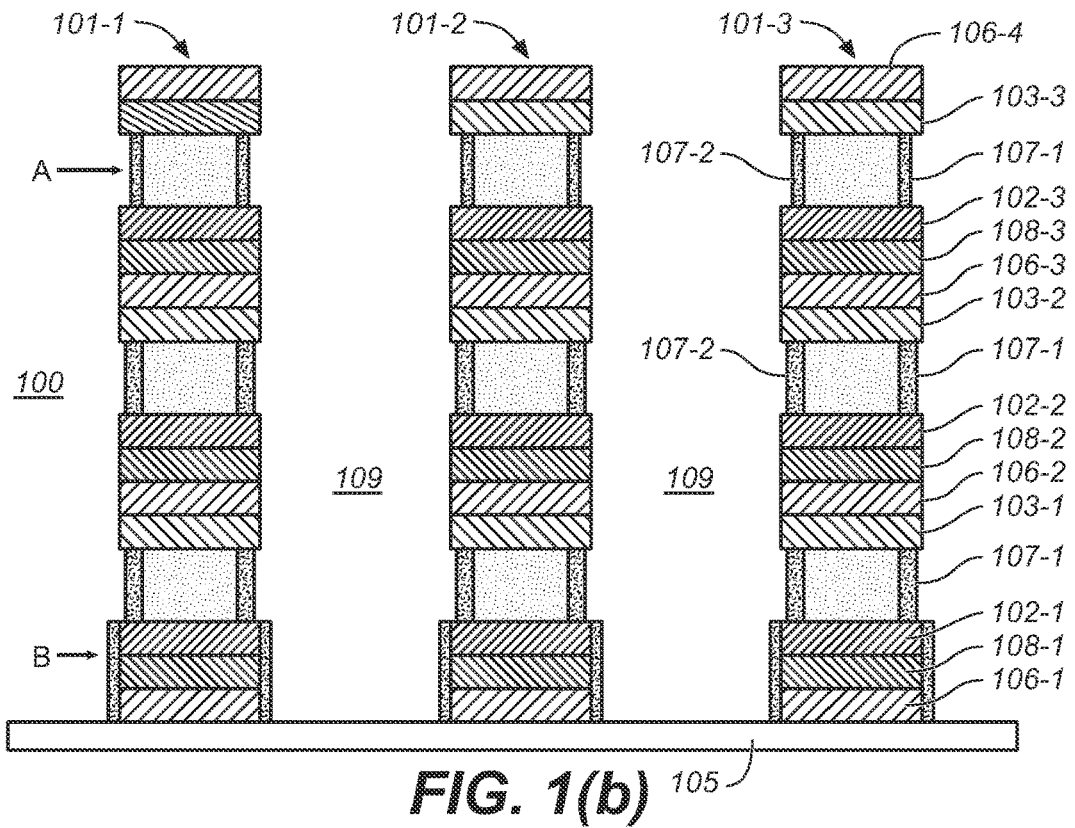
FIG. 1(b) shows one instance of resulting structure 100 after a separation etch.
Figure 2A:
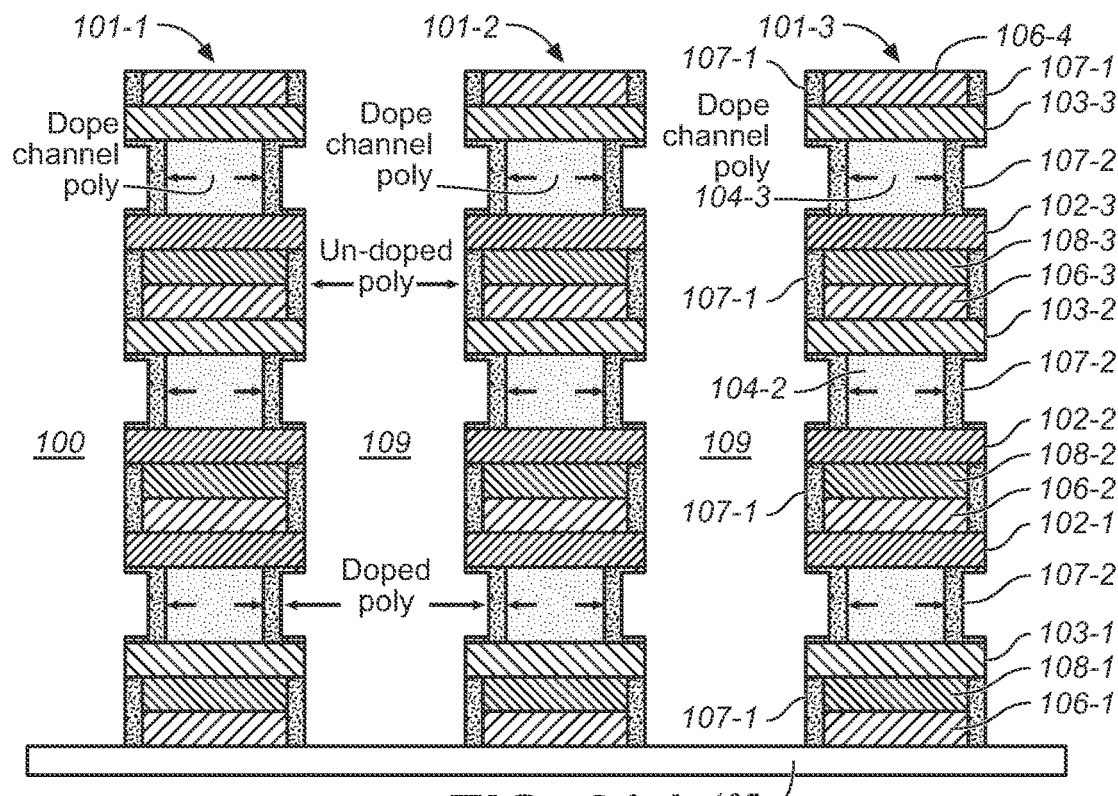
FIG. 2(a) show the resulting structure 100, in which the portions of channel semiconductor material 107 on the sidewalls of trenches 109 are designated 107-1, while the boron-doped portions of the channel semiconductor material 107 adjacent body oxide layers 104 are designated 107-2, in accordance with one embodiment of the present invention.

According to a first embodiment of the present invention, body oxide layers 104 of structure 100 of FIG. 1(a) is heavily boron-doped (i.e., p$^+$-type), as deposited, while common drain regions 102 and common source regions 103 are arsenic-doped (i.e., n$^+$-type). In this embodiment, body oxide layer 104 may be, for example, a 50-nm thick organosilicon layer (e.g., SiOCH) with a dopant concentration of about $1.0\times10^{20}$ cm$^{-3}$ or greater. After conformal deposition of channel semiconductor material layers 107 (e.g., intrinsic polysilicon), an annealing step (e.g., a rapid thermal annealing (RTA) step at 750° C. for 10 min.) is carried out. As a result of the annealing step, boron from body oxide layers 104 out-diffuses into their adjacent portions of channel semiconductor material 107, resulting in a dopant concentration in those portions of, for example, between about $5.0\times10^{18}$ cm$^{-3}$ and about $1.0\times10^{19}$ cm$^{-3}$. During this time, some amount of arsenic may also out-diffuse from common drain layers 102 and common source layers 103 into their respective adjacent portions of channel semiconductor material 107. However, as boron has a much higher diffusion rate than arsenic above 650° C., the arsenic diffusion is relatively inconsequential. FIG. 2(a) show the resulting structure 100, in which the portions of channel semiconductor material 107 on the sidewalls of trenches 109 are designated 107-1, while the boron-doped portions of the channel semiconductor material 107 adjacent body oxide layers 104 are designated 107-2.

Figure 2B:
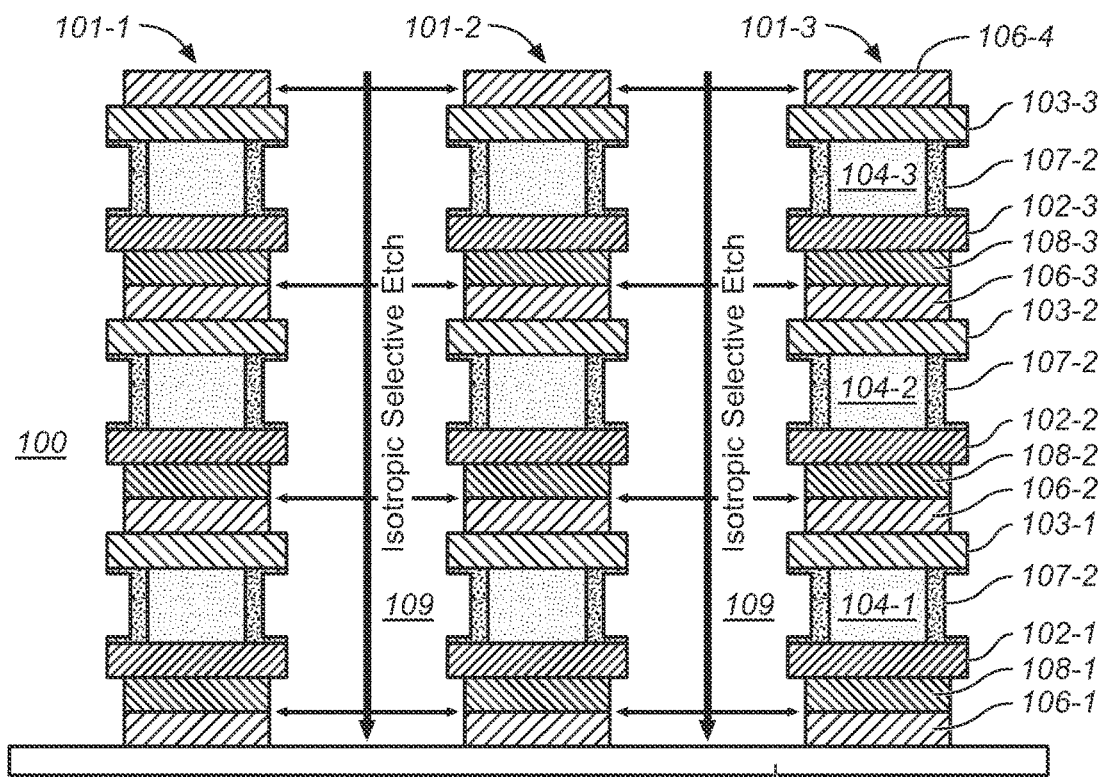
FIG. 2(b) shows the resulting structure 100 after a selective etch using an etchant has a significantly different etch rate between undoped polysilicon and doped silicon of a predetermined dopant concentration or greater.

A selective etch using, for example, tetra-methyl ammonium hydroxide (TMAH) may be used to remove channel semiconductor material 107-1 from the sidewalls of trenches 109, leaving behind channel semiconductor material 107-2 in the recesses of body oxide layers 104, as TMAH has an etch rate that is at least 5 times higher for undoped polysilicon than doped polysilicon of dopant concentration of at least about $10^{18}$ cm$^{-3}$. The selective etch may an isotropic wet etch or dry etch. The resulting structure is shown in FIG. 2(b).

Other etchants with high selectivity of undoped polysilicon over doped polysilicon may also be used. For example, potassium hydroxide (KOH) has a selectivity of 20:1 for undoped polysilicon over doped polysilicon of a dopant concentration exceeding $10^{20}$ cm$^{-3}$. Likewise, an aqueous solution of ethylene diamine and pyrocatechol (EDP) has a selectivity of 50:1 for undoped polysilicon over doped polysilicon of a dopant concentration exceeding $7.0 \times 10^{19}$ cm$^{-3}$.

According to another embodiment of the present invention, body oxide layers 104 of structure 100 of FIG. 1(a) is carbon-doped, as deposited, while common drain regions 102 and common source regions 103 are arsenic-doped (i.e., n$^+$-type). In this embodiment, body oxide layer 104 may be, for example, a 50-nm thick carbon-doped oxide with a carbon dopant concentration of about $5.0 \times 10^{20}$ cm$^{-3}$ or greater. After conformal deposition of channel semiconductor material layers 107 (e.g., in situ boron-doped polysilicon of a desired dopant concentration), an RTA step (e.g., at 750° C. for 10 min.) is carried out. As a result of the annealing step, carbon from body oxide layers 104 out-diffuses into their adjacent portions of channel semiconductor material 107, resulting in a dopant concentration in those portions of, for example, to about $5.0 \times 10^{20}$ cm$^{-3}$.

A selective etch using, for example, EDP may be used to remove channel semiconductor material 107-1 from the sidewalls of trenches 109, leaving behind carbon-doped channel semiconductor material 107-2 in the recesses of body oxide layers 104, as EDP has an etch rate that is at least 100 times higher for undoped polysilicon than carbon-doped polysilicon of dopant concentration of at least about $10^{20}$ cm$^{-3}$. The selective etch may an isotropic wet etch or dry etch.

Figure 3:
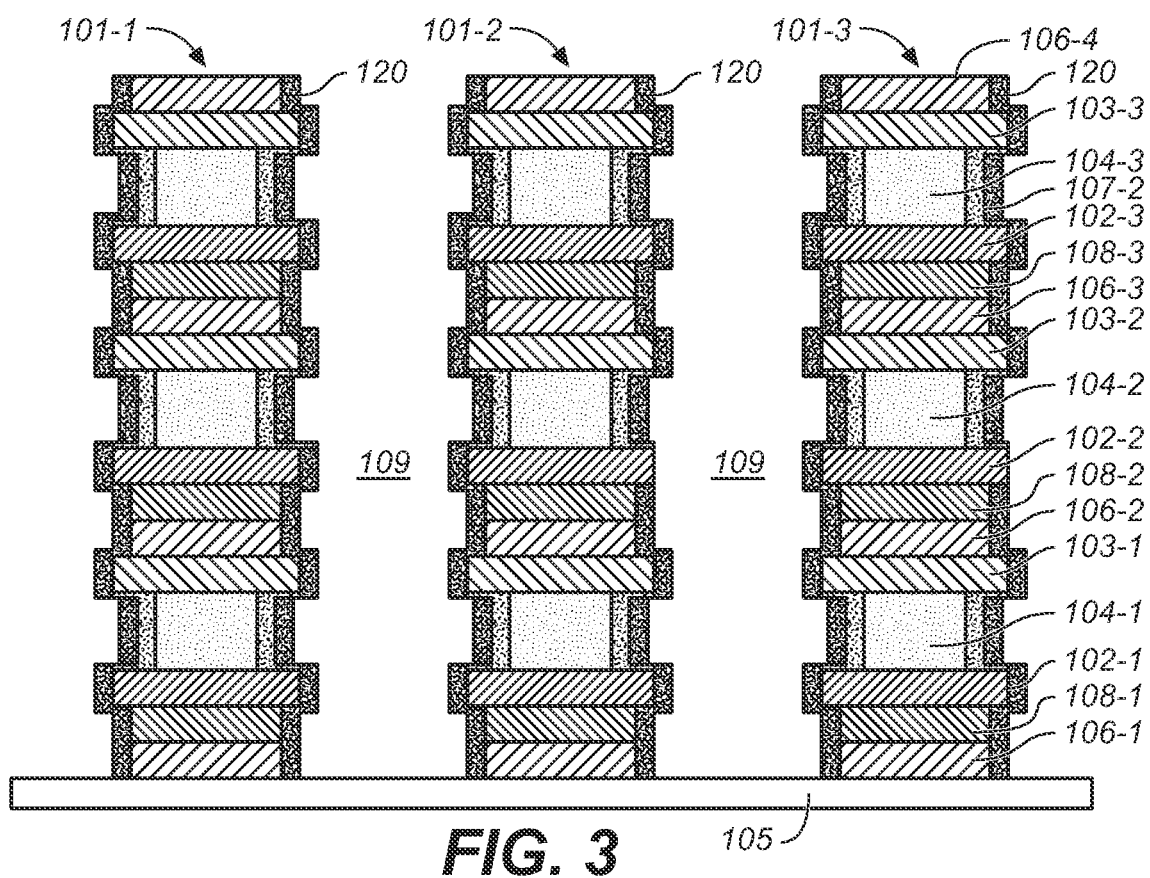
FIG. 3 shows, after the selective etch of FIG. 2(b), a thin layer of phosphorus silicate glass (PSG), e.g., 10-nm thick, may be deposited on structure 100, in accordance with one embodiment of the present invention.

One consideration associated with the methods of the present invention is their effects on the threshold voltage ($V_{th}$) of the resulting thin-film transistor. In one embodiment, at a dopant concentration of $5.0 \times 10^{19}$ cm$^{-3}$, the resulting $V_{th}$ may be much greater than the more desirable 1.5 volts achievable at the lesser dopant concentration of $5.0 \times 10^{18}$ cm$^{-3}$. In that regard, to take advantage of the high selectivity of either KOH or EDP, the $V_{th}$ of the resulting thin-film transistors may be too high. To fine-tune the dopant concentration, one may counter-dope channel semiconductor material 107-2 after the selective etch of FIG. 2(b). According to one embodiment of the present invention, after the selective etch of FIG. 2(b), a thin layer 120 of phosphorus silicate glass (PSG), e.g., 10-nm thick, may be deposited on structure 100, as shown in FIG. 3. Phosphorus in the PSG is then allowed to diffuse into channel semiconductor material 107-2 in a subsequent annealing step. The initial dopant concentration in the PSG, and the temperature and the duration of this subsequent RTA step may be empirically determined to achieve a given desired $V_{th}$ in the resulting thin-film transistors. Generally, at temperatures lower than 1000° C., phosphorus has a greater diffusion rate in polysilicon than boron. PSG layer 120 may be removed by wet isotropic etching after the RTA step (e.g., using hydrofluoric acid (HF)).

Alternatively, rather than converting the dopant concentration in the portions of channel semiconductor material 107 adjacent body oxide layers 104, one may instead convert portions of channel semiconductor material 107 on the sidewalls of trenches 109. According to one embodiment of the present invention, isolation layers 106 are initially deposited as heavily doped n$^{++}$-type c-silicon (SiOC), with a phosphorus dopant concentration of greater than $5.0 \times 10^{20}$ cm$^{-3}$, for example. In this embodiment, channel semiconductor material 107 may be deposited in situ doped to the desired dopant concentration for the channel regions (e.g., $1.0 \times 10^{18}$ cm$^{-3}$). Without a high dopant concentration in body oxide layers 104, a subsequent RTA annealing step turns the portions of channel semiconductor material 107 adjacent isolation layers 106 into n-type semiconductor material 107-3, as shown FIG. 4(i). Using HF or a fluorocarbon gas, n-type channel semiconductor material 107-3 may be removed at up to a 40:1 selectivity of n$^{++}$-type polysilicon (e.g., dopant concentration of $3.0 \times 10^{20}$ cm$^{-3}$ or greater) over p-type polysilicon. It is believed that the difference in selectivity results from sensitivity to the phosphorus dopant profile. (See, e.g., Solid State Science and Technology, 2 (9). pp. 380-P383 (2013)). The resulting structure is shown FIG. 4(ii). Note that, unlike the other embodiments described above, in this embodiment, some portions of channel semiconductor material 107-3 remains on the sidewalls of trenches 109, although the result channel regions in the active strips achieve electrical isolation from each other.

According to another embodiment of the present invention, isolation layers 106 are initially deposited as heavily doped p$^{++}$-type borosilicate (BSG), with a boron dopant concentration of greater than $5.0 \times 10^{21}$ cm$^{-3}$, for example. In this embodiment, a 10-nm thick channel semiconductor material 107 may be deposited in situ doped to the desired dopant concentration for the channel regions (e.g., $1.0 \times 10^{18}$ cm$^{-3}$). An RTA annealing step (e.g., at 600° C. for a duration of 14 minutes, including the deposition time of channel semiconductor material 107) turns the portions of channel semiconductor material 107 adjacent isolation layers 106 into 10-nm thick p-type semiconductor material 107-3, as shown in FIG. 5(i). At 600° C., boron diffuses substantially faster than arsenic, such that the diffusion into the portions of channel semiconductor material 107 adjacent common source regions 103 and common drain regions 102 are inconsequential (e.g., less than 1.0 nm). Note that in FIGS. 5(i) and (ii), buffer oxide layer 121 may be added between isolation layers 106 and adjacent common source regions 103 to avoid boron diffusion into source regions 103. Also, BSG layers 106, buffer oxide 121 and body oxide layers 104 are recessed in a previous oxide etch step.

Using an aqueous HF solution (e.g., one part HF to 50 parts nitric acid and 100 parts acetic acid, by volume), p-type channel semiconductor material 107-3 may be removed at up to a 50:1 selectivity of p-type polysilicon (e.g., dopant concentration of $5.0 \times 10^{21}$ cm$^{-3}$ or greater) over undoped or lightly-doped polysilicon. An even greater selectivity may be achieved using a lower percentage of nitric acid ($HNO_3$). To achieve the same result in a dry-etch step, HF, $HNO_3$ and acetic acid ($CH_3COOH$) vapors may be used. (See, e.g., U.S. Pat. No. 4,681,657 to Hwang et al.). The resulting structure is shown in FIG. 5(ii).

Alternatively, rather than BSG, PSG may be used as isolation layers 106. FIGS. 6(i)-6(iii) illustrate a third alternatively embodiment of the present invention, in which isolation layers 106 dope their adjacent channel semiconductor material 107 for selective removal, in accordance with one embodiment of the present invention. As shown in FIG. 6(*i*), isolation layers 106 are initially deposited as heavily doped PSG, with a phosphorus dopant concentration of greater than $1.0 \times 10^{22}$ cm$^{-3}$, for example. In this embodiment, channel semiconductor material 107 may be deposited as in situ doped amorphous silicon at 550° C. or as polysilicon at 625° C. to the desired dopant concentration for the channel regions (e.g., $1.0 \times 10^{18}$ cm$^{-3}$). In addition, 2-nm capping layer 122 of silicon oxide or silicon nitride, deposited at a temperature of 650° C. or less may be provided to prevent diffusion of the phosphorus out of channel semiconductor material 107. In this embodiment, both common source regions 103 and common drain regions 102 are provided adjacent metal layers 108 to reduce resistivity.

Thereafter, as illustrated in FIG. 6(*ii*), an RTA annealing step at 820° C. for 60 seconds or less turns the portions of channel semiconductor material 107 adjacent isolation layers 106 into heavily doped n-type channel semiconductor material 107-3, activating the phosphorus dopants at the same time (e.g., to an equilibrium dopant concentration of about $3.0 \times 10^{20}$ cm$^{-3}$). The deposited amorphous silicon is also crystallized as channel semiconductor material 107-2. At 820° C., arsenic diffusion from common source regions 103 and common drain regions 102 into channel semiconductor 107 is insignificant.

Thereafter, capping layer 122 is isotropically removed. Using an atomic chlorine gas, heavily-doped n-type channel semiconductor material 107-3 may be removed at a greater than 6:1 selectivity of n-type polysilicon (e.g., dopant concentration of about $3.0 \times 10^{20}$ cm$^{-3}$ or greater) over lightly-doped p-type polysilicon, as illustrated in FIG. 6(*iii*).

The above detailed description is provided to illustrate specific embodiments of the present invention and is not intended to be limiting. Numerous modifications and variations within the scope of the present invention are possible. The present invention is set forth in the accompanying claims.

We claim:

1. A process, comprising:
   providing a semiconductor substrate having a planar surface;
   forming a plurality of thin-film layers above the planar surface of the semiconductor substrate, one on top of another, including among the thin-film layers first and second isolation layers, wherein a significantly greater concentration of a first dopant specie is provided in the first isolation layer than in the second isolation layer;
   etching along a direction substantially orthogonal to the planar surface through the thin-films to create a trench having sidewalls that expose the thin-film layers;
   depositing conformally a semiconductor material on the sidewalls of the trench;
   annealing the first isolation layer at a predetermined temperature and a predetermined duration such that the first isolation layer act as a source of the first dopant specie which dopes a portion of the semiconductor material adjacent the first isolation layer; and
   selectively etching the semiconductor material to remove the doped portion of the semiconductor material without removing the remainder of the semiconductor material.

2. The process of claim 1, further comprising etching the thin-film layers such that the first isolation layer recesses from the sidewalls of the trench.

3. The process of claim 1 wherein the semiconductor material comprises at least one of: an amorphous silicon and a polysilicon.

4. The process of claim 1, wherein selective etching comprises a dry etching step.

5. The process of claim 1, wherein (i) the first isolation layer comprises one or more of: an organosilicon layer, a silicon nitride layer and a silicate glass, and (ii) the selective etching uses an etchant that comprises at least one of: tetra-methyl ammonium hydroxide (TMAH), potassium hydroxide (KOH), and ethylene diamine and pyrocatechol (EDP).

6. The process of claim 5, wherein the annealing step comprises a rapid thermal annealing step, and wherein the predetermined temperature is between 650° C. and 820° C., preferably about 750° C.

7. The process of claim 5, wherein the first dopant specie comprises boron.

8. The process of claim 5, wherein the organosilicate layer comprises SiOCH or SiOC.

9. The process of claim 1, wherein the first isolation layer is carbon-doped with a carbon dopant concentration of about $10^{20}$ cm$^{-3}$ or greater, and wherein the selective etching uses an etchant that comprises ethylene diamine and pyrocatechol (EDP).

10. The process of claim 9, wherein the annealing step comprises a rapid thermal annealing step, and wherein the predetermined temperature is between about 600° C. and about 820° C., preferably about 750° C.

11. The process of claim 1, further comprising depositing a highly doped material adjacent and over the semiconductor material, the highly doped material comprises a second dopant specie, and annealing the second dopant specie to adjust an effective dopant concentration in the semiconductor material.

12. The process of claim 11, wherein the effective dopant concentration determines a threshold voltage of a thin-film transistor in which the semiconductor material serve as a channel region.

13. The process of claim 11, wherein the first dopant specie comprises boron and the second dopant specie comprise phosphorus.

14. The process of claim 1, wherein (i) the first isolation layer comprises one or more of: an organosilicon layer, a silicon nitride layer and a silicate glass, and (ii) the selective etching uses an etchant that comprises at least one of: atomic chlorine, HF and a fluorocarbon gas.

15. The process of claim 14, wherein the annealing step comprises a rapid thermal annealing step, and wherein the predetermined temperature is between about 600° C. and about 820° C., preferably about 750° C.

16. The process of claim 14, wherein the first dopant specie comprises phosphorus.

17. The process of claim 14, wherein the etchant is provided in an solution aqueous HF solution that includes both HF and one or more of: nitric acid and acetic acid.

18. The process of claim 1, further comprising depositing a capping layer over the conformally deposited semiconductor material.

19. The process of claim 18, wherein the first isolation layer comprises a borosilicate glass or phosphorus silicate glass with a dopant concentration of boron or phosphorus greater than $1.0 \times 10^{22}$ cm$^{-3}$.

* * * * *